(12) United States Patent
Mueller et al.

(10) Patent No.: US 9,663,399 B2
(45) Date of Patent: May 30, 2017

(54) METHOD FOR PRODUCING A CONTROL ELEMENT AND CONTROL ELEMENT

(71) Applicant: AUDI AG, Ingolstadt (DE)

(72) Inventors: Ulrich Mueller, Ingolstadt (DE); Johann Schneider, Wettstetten (DE); Marcus Kuehne, Beilngries (DE); Michael Wachinger, Winkelhausen (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/783,140

(22) PCT Filed: Mar. 28, 2014

(86) PCT No.: PCT/EP2014/000843
§ 371 (c)(1),
(2) Date: Oct. 8, 2015

(87) PCT Pub. No.: WO2014/166598
PCT Pub. Date: Oct. 16, 2014

(65) Prior Publication Data
US 2016/0046521 A1    Feb. 18, 2016

(30) Foreign Application Priority Data

Apr. 8, 2013 (DE) .................. 10 2013 006 069

(51) Int. Cl.
*G06F 3/0488* (2013.01)
*C03C 17/00* (2006.01)
(Continued)

(52) U.S. Cl.
CPC ............ *C03C 17/001* (2013.01); *B60K 35/00* (2013.01); *B60K 37/06* (2013.01);
(Continued)

(58) Field of Classification Search
USPC .................. 427/98.4, 282; 345/173
See application file for complete search history.

(56) References Cited

U.S. PATENT DOCUMENTS 4,340,813 A    7/1982   Sauer
4,855,550 A *  8/1989   Schultz, Jr. ............. F24C 7/082
                                                            200/600
(Continued)

FOREIGN PATENT DOCUMENTS

DE    2936815    4/1981
DE    3149722    9/1982
(Continued)

OTHER PUBLICATIONS

Anonymous, "Siebdruck—Wikipedia," Jan. 22, 2013, pp. 1-29, retrieved from https://web.archive.org/web/20130122040058/http://de.wikipedia.org/wiki/Siebdruck (with 13 page English Wikipedia "Screen Printing"document, downloaded on Jul. 16, 2015 from https://en.wikipedia.org/wiki/Screen_printing).

(Continued)

*Primary Examiner* — Brian K Talbot
(74) *Attorney, Agent, or Firm* — Staas & Halsey LLP

(57) ABSTRACT

A method produces a control element having a touch-enabled surface, in which a paste-like material is applied on a carrier plate. At least one raised structure element is formed by the paste-like material on the carrier plate. For this purpose, a stencil having inherent stiffness is arranged above the carrier plate and the paste-like material is pushed through at least one recess in the stencil.

12 Claims, 3 Drawing Sheets

(51) Int. Cl.
*B60K 35/00* (2006.01)
*B60K 37/06* (2006.01)
*G06F 3/0354* (2013.01)
*G06F 3/041* (2006.01)
*H05K 3/12* (2006.01)
*B05D 1/32* (2006.01)
*B05D 1/40* (2006.01)
*B05D 5/12* (2006.01)

(52) U.S. Cl.
CPC .......... *G06F 3/03547* (2013.01); *G06F 3/041* (2013.01); *G06F 3/04886* (2013.01); *B05D 1/32* (2013.01); *B05D 1/40* (2013.01); *B05D 5/12* (2013.01); *B60K 2350/1024* (2013.01); *B60K 2350/1028* (2013.01); *C03C 2217/20* (2013.01); *C03C 2217/77* (2013.01); *C03C 2217/78* (2013.01); *C03C 2218/11* (2013.01); *C03C 2218/34* (2013.01); *G06F 2203/04103* (2013.01); *G06F 2203/04809* (2013.01); *H05K 3/1216* (2013.01); *H05K 3/1225* (2013.01)

(56) References Cited

U.S. PATENT DOCUMENTS

| | | | |
|---|---|---|---|
| 5,649,480 A * | 7/1997 | Yim | B41M 3/16 101/129 |
| 6,502,032 B1 * | 12/2002 | Newman | G09B 21/003 345/156 |
| 8,124,903 B2 | 2/2012 | Tatehata et al. | |
| 8,405,618 B2 * | 3/2013 | Colgate | G06F 3/016 341/22 |
| 2002/0197455 A1 | 12/2002 | Richter et al. | |
| 2005/0260338 A1 * | 11/2005 | Chien | C03C 17/36 427/96.1 |
| 2006/0024900 A1 * | 2/2006 | Lee | H01L 21/4857 438/381 |
| 2006/0267960 A1 | 11/2006 | Liao et al. | |
| 2009/0194343 A1 | 8/2009 | Soumi | |
| 2009/0237370 A1 * | 9/2009 | Meier-Arendt | G06F 3/0488 345/173 |
| 2010/0200539 A1 | 8/2010 | Yun et al. | |
| 2010/0231508 A1 * | 9/2010 | Cruz-Hernandez | G06F 3/0488 345/156 |
| 2011/0285637 A1 * | 11/2011 | Karkkainen | G06F 3/016 345/173 |
| 2012/0062504 A1 * | 3/2012 | Kim | G06F 3/044 345/174 |
| 2012/0306757 A1 * | 12/2012 | Keist | B29C 45/0053 345/168 |
| 2013/0017321 A1 * | 1/2013 | Kim | G06F 3/044 427/108 |

FOREIGN PATENT DOCUMENTS

| | | |
|---|---|---|
| DE | 3844392 | 7/1989 |
| DE | 102006021270 | 1/2007 |
| DE | 102008014033 | 10/2008 |
| DE | 102011013599 | 9/2012 |
| DE | 10 2013 006 069.9 | 4/2013 |
| EP | 1352384 | 4/2010 |
| WO | WO 96/41320 * | 12/1996 |
| WO | 01/57843 | 8/2001 |
| WO | 2005/015319 | 2/2005 |
| WO | 2007/017485 | 2/2007 |
| WO | PCT/EP2014/000843 | 3/2014 |

OTHER PUBLICATIONS

German Office Action for German Priority Patent Application No. 10 2013 006 069.9, issued Mar. 10, 2014, 7 pages.
English language International Search Report for PCT/EP2014/000843, mailed on Dec. 10, 2014, pages.
WIPO English language translation of the International Preliminary Report on Patentability for PCT/EP2014/000843, downloaded from the WIPO website on Oct. 8, 2015, 8 pages.

* cited by examiner (State of the art)

(State of the art)

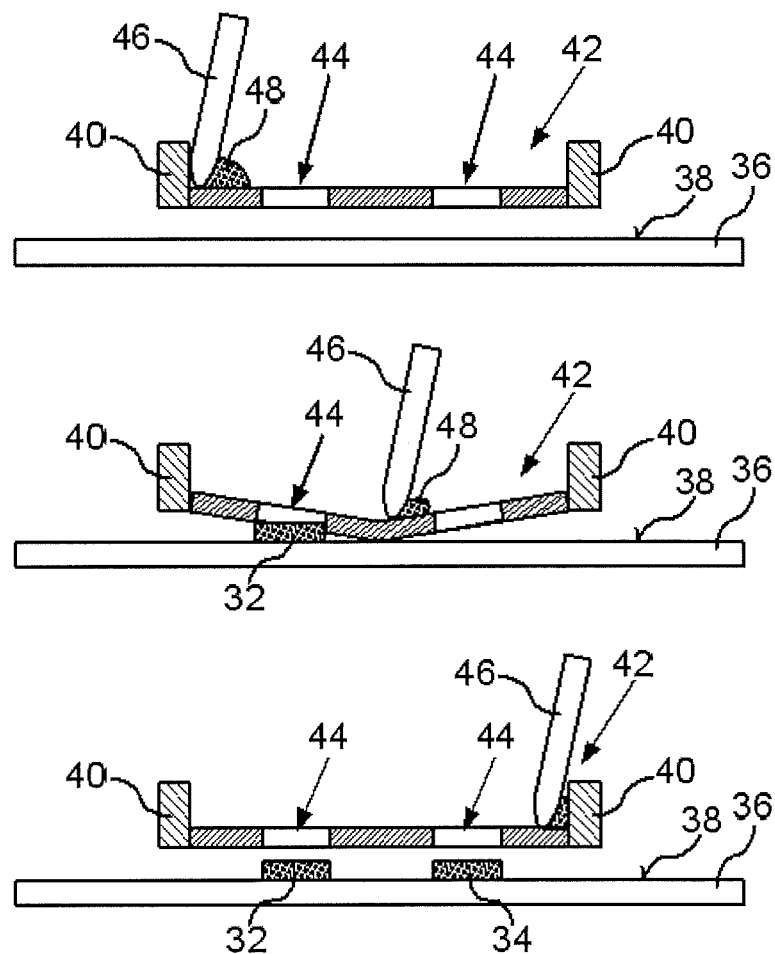
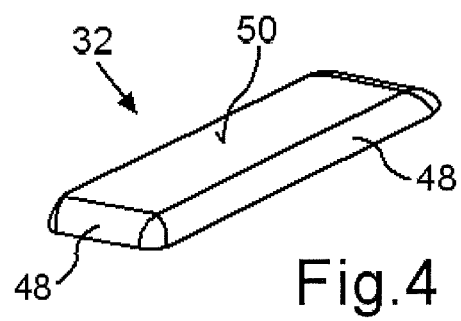
Fig.3
Fig.4

METHOD FOR PRODUCING A CONTROL ELEMENT AND CONTROL ELEMENT

CROSS REFERENCE TO RELATED APPLICATIONS

This application is based on and hereby claims priority to International Application No. PCT/EP2014/000843 filed on Mar. 28, 2014 and German Application No. 10 2013 006 069.9 filed on Apr. 8, 2013, the contents of which are hereby incorporated by reference.

BACKGROUND

The invention relates to a method for producing a control element having a touch-sensitive zone, in which method a paste-like material is applied to a carrier plate. Furthermore, the invention relates to a control element, in particular for a motor vehicle.

Control elements with touch-sensitive zones are being increasingly used in motor vehicles for inputting user instructions, for example for actuating functional units such as Infotainment systems.

EP 1 352 384 B1 describes the manufacture of a touch screen in which a resistance layer is applied to a carrier plate made of glass. The application of a pattern of conductive edge electrodes and of conductor tracks to the resistance layer is carried out by a screen printing method in which a silver frit composition is printed onto the resistance layer.

US 2002/0197455 A1 also describes the application of electrodes to an insulation layer of a touch screen. Here, the insulation layer covers a resistance layer which is arranged on a glass substrate, and the electrodes are formed on the insulation layer by a screen printing method.

US 2010/0200539 A1 describes a method for producing a touch screen in which a layer of indium-tin-oxide is arranged on a plastics substrate. Etching paste is applied to this oxide layer. The oxide layer is removed from the places provided with the etching paste by increasing the temperature, and in this way the plastic substrate is exposed.

DE 10 2006 021 270 A1 describes the printing of operator controlled symbols onto an acrylic screen by screen printing.

WO 2007/017485 A2 describes a touch screen in which a layer of organic light-emitting diodes is applied by a printing method to electrodes which are arranged on a substrate.

SUMMARY

One possible object is to provide a method of the type mentioned at the beginning and a control element which can be obtained by the method, with which method particularly well defined structural elements can be formed or are present on the carrier plate.

The inventors propose a method in which at least one raised structural element is formed on the carrier plate by the paste-like material. This is done firstly by arranging an inherently rigid stencil over the carrier plate. The paste-like material is then pressed through at least one cutout in the stencil. The contour of the cutout therefore predetermines the contour of the structural element corresponding to the cutout. A clean, defined edge of the structural element is also predefined here by the edge of the cutout.

In addition it is advantageous that the cutout in the stencil is free of any threads, fibers, or loops, such as are present when a screen printing method is applied. If, in fact, the paste-like material is pressed through fabric regions which are permeable to this material in the screen printing method, the paste-like material which is then applied to the carrier plate has a certain degree of unevenness, corrugations and frayed edges. In particular, the threads of the fabric or screen are apparent on the surface of the structural element, and accordingly the structural element which is produced by a screen printing method has an irregular surface.

In contrast, by using the inherently rigid stencil with the at least one cutout a particularly clean and good definition of the structural elements can be achieved, since there are in fact no threads or the like present in the region of the cutouts in the stencil. In addition, a particularly viscous and firm paste-like material can be used, since it is no longer necessary for the paste to disperse after the removal of a screen which is used in a screen printing method.

As result of the fact that the raised structural elements on the carrier plate have clean edges and a defined height, they are particularly visually attractive. In addition, a desired shape of the respective structural element can be made available through the selection of a respective shape of the cutout. In addition to the use of the structural elements on the carrier plate as design elements, haptic landscapes can also be formed, as well as structures which can be felt with a person's finger, by the raised structural elements.

If the paste-like material contains color pigments, a particularly high level of flexibility can also be produced when selecting the color of the raised structural elements.

In one advantageous refinement, the paste-like material is applied to the at least one cutout in the stencil in such a way that a height of the at least one structural element corresponds to a thickness of the stencil. The height of the structural elements can therefore be set in a targeted fashion both by the selection of the consistency of the paste-like material as well as by the thickness of the stencil, which thickness is, if appropriate, locally different. This makes it possible, in particular, to form structural elements of a comparatively large height on the carrier plate, which structural elements can then be perceived haptically particularly well.

If it was desired to make available structural elements with a particularly large height by a screen printing method, this would require the use of a fabric with particularly thick threads. These relatively thick threads would then, however, become particularly apparent in the structural element. In contrast, by sensing the cutout in the inherently rigid stencil with the paste-like material a corresponding structural element with a correspondingly large height can be made available which is free of any irregularities owing to threads or the like becoming apparent.

It has also proven advantageous if a ceramic material is applied as paste-like material to the carrier plate. The structural elements which are then formed from the ceramic material are in fact particularly abrasion-proof and scratch-proof, with the result that they have a particularly high level of robustness and long service life.

It has also proven advantageous if the paste-like material is connected by heating to the carrier plate. This permits a particularly intimate and at the same time stable connection of the structural elements to the carrier plate, which therefore does not weaken the structure of the carrier plate.

In particular, if a ceramic material is applied as paste-like material to the carrier plate it is favorable to form the carrier plate—or at least the surface thereof—from a glass, since ceramic structural elements can be connected particularly well to the glass by heating.

It has also proven advantages if a sensing aid for a user of the control element is made available by the at least one raised structural element. The provision of such sensing aids or orientation aids on the carrier plate—for example in the form of webs, curves or the like—permits the user to carry out operator control actions reliably on the control element without the user having to direct his gaze onto the touch-sensitive zone of the control element. This is advantageous in particular if the control element is used in a motor vehicle, since the user, for example, the driver of the motor vehicle, then does not need to avert his gaze from the events on the road. Instead, he can find the areas of the control element which he wishes to touch in order to perform operator control actions by the sensing aids.

In another advantageous refinement, the inherently rigid stencil is formed by a piece of sheet metal. In such a piece of sheet metal it is in fact possible to make available in a particularly easy and clean way cutouts or holes which predefine the shape of the raised structural elements to be formed. This is favorable for predefining correspondingly cleanly defined structural elements by the cutouts.

The at least one cutout in the piece of sheet metal can be produced, in particular, by laser cutting and/or by punching. With such cutting methods it is, in fact, possible to make available particularly clean and straight edges of the cutouts, which in turn give rise to correspondingly well defined and straight edges of the structural elements.

The inventors also propose a control element, in particular, for a motor vehicle. The proposed control element comprises a carrier plate and has a touch-sensitive zone. At least one raised structural element is formed on the carrier plate, said raised structural element being produced by pressing a paste-like material through at least one cutout in an inherently rigid stencil. The at least one raised structural element is so particularly well defined and does not have any unevennesses, corrugations, frayed edges or the like but instead has a particularly level surface and particularly sharply defined contours. This makes the raised structural elements particularly well suited to making available sensing aids or orientation aids for a user of the control element.

The control element can be embodied, in particular, as a touchpad or as a touch screen by which functional units of the motor vehicle can be actuated.

The advantages and preferred embodiments which are described for the proposed method also apply to the proposed control element, and vice versa.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 3 shows the application of structural elements, formed from a ceramic paste, to a glass surface of a control element which is shown in FIG. 5, wherein a perforated stencil made of a piece of sheet metal is used;

FIG. 4 is a schematic enlarged illustration of one of the structural elements which are obtained by the method according to FIG. 3 and are then located on the glass surface.

DETAILED DESCRIPTION OF THE PREFERRED EMBODIMENT

Figure 1:
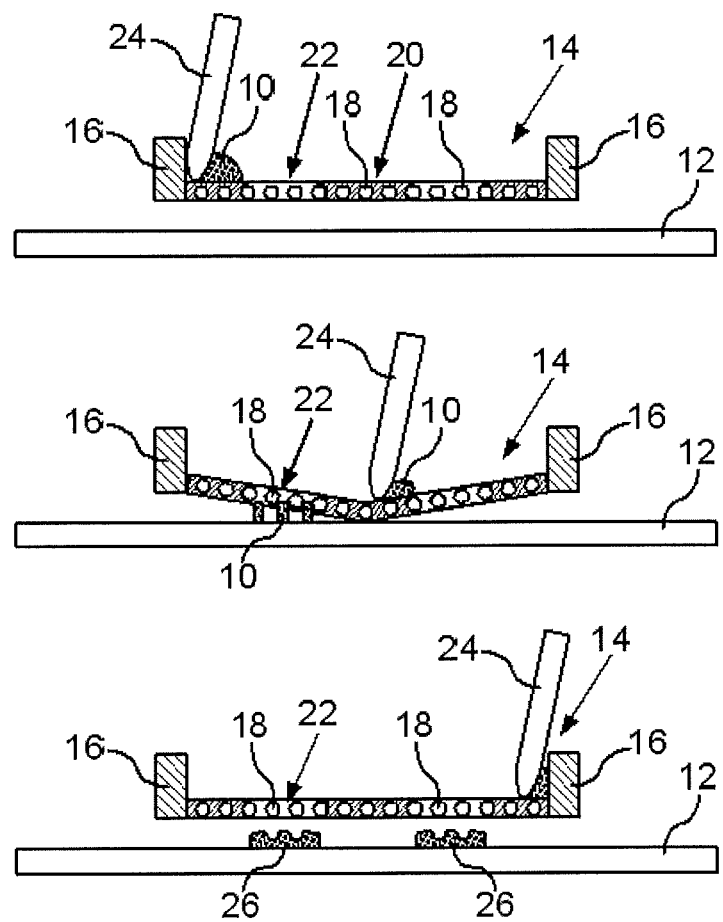
FIG. 1 shows a method which is known from the related art and in which a printing ink is applied to a print medium by screen printing.

Reference will now be made in detail to the preferred embodiments of the present invention, examples of which are illustrated in the accompanying drawings, wherein like reference numerals refer to like elements throughout.

The screen printing method which is known from the related art, and by which printing ink 10 can be applied to a print medium 12, will now be illustrated with reference to FIG. 1.

In the screen printing method, a screen 14 is used which comprises a frame 16 over which a fabric is stretched. The individual threads 18 of the fabric are illustrated schematically in FIG. 1. The fabric is coated with a material, for example a photopolymer, and then exposed in areas 20 in which color is not be applied to the print medium 12. The photopolymer which is not set is washed out at the other locations 22. In the screen 14, the areas 20 of the fabric which are impermeable to printing ink 10 then alternate with the locations 22 in the fabric at which the printing ink 10 can be pressed through the screen 14.

The printing ink 10 is pressed through the fabric using a doctor blade 24 at these locations 22, and said printing ink 10 passes onto the print medium 12 (cf. the middle figure in FIG. 1). Subsequently, the printing ink 10 disperses in the region of the locations 22 on the print medium 12 and forms structures 26 in which the threads 18 of the fabric are apparent.

Figure 2:
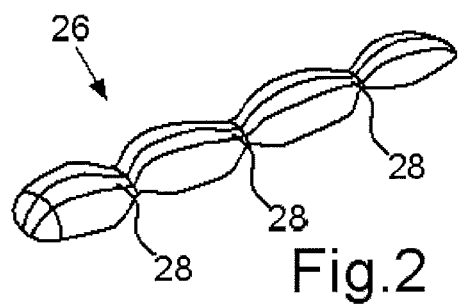
FIG. 2 is a schematic enlarged illustration of a structural element which is obtained by the screen printing method according to FIG. 1 and is then located on the print medium.

Correspondingly, the structures 26 on the print medium 12 have unevennesses, corrugations or restrictions 28 at the locations at which the threads 18 of the screen 14 are located during the application of the printing ink 10 to the print medium 12 (cf. FIG. 2).

The irregular shape of the structures 26 which can be obtained by the screen printing method is undesirable. Therefore, another method is used here in order to form raised structural elements, for example in the form of webs 32 or curves 34 on a control element such as for example a touch pad 30 (cf. FIG. 5).

A tampon printing method, in which the paste-like material to be transferred is firstly arranged on a die and then transferred to the carrier to be printed on, is in fact also unsuitable for applying raised structural elements, which can serve as sensing aids, to a surface 38 of the touch pad 30. The quantity of ink or paste which can be applied in this way is in fact not sufficient to form raised structures which can be used as sensing aids.

Figure 5:
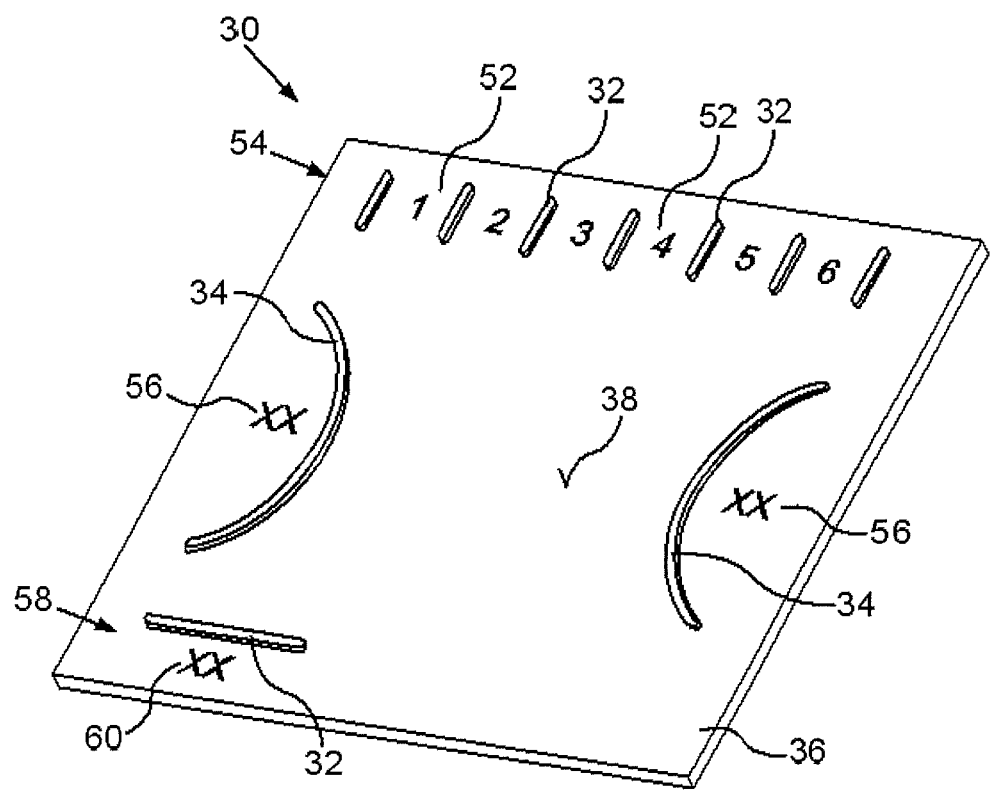
FIG. 5 shows the control element which has a surface made of glass and onto which the structural elements made of ceramic are applied by the method illustrated with reference to FIG. 3.

The touch pad 30 has a carrier plate 36 which is made of glass and on the surface 38 of the which the webs 32 and curves 34 are formed (cf. FIG. 5). The procedure during the formation of these structural elements is illustrated with reference to FIG. 3.

A stencil 42 which is secured in a frame 40 is arranged over the carrier plate 36. The inherently rigid stencil 42 is formed from a piece of sheet metal in which cutouts 44 in the form of holes or slits or the like are provided. The cutouts 44 are located at the locations at which the webs 32 and curves 34 are to be arranged on the carrier plate 36. A ceramic paste 48 is then pressed through the cutouts 44 in the stencil 42 with a doctor blade 46 or similar tool (cf. the middle illustration in FIG. 3). The portion of the ceramic paste 48 which is pressed through the respective cutouts 44 forms the raised structural elements, for example in the form of the webs 32 or curves 34 on the surface 38 of the carrier plate 36 (cf. the middle and lower illustrations in FIG. 3).

The cutouts 44 in the piece of sheet metal of the stencil 42 can be lasered or punched. As a result of the fact that there are no threads whatsoever of a fabric or the like in the region of the cutouts 44, there are also no threads apparent in the webs 32 or curves 34. A defined height of the webs 32 or curves 34 can also be predefined by predefining the thickness of the piece of sheet metal of the stencil 42.

FIG. 4 is a schematic view of one of the webs 32. This web 32 has clean edges 48 and a smooth level surface 50.

After the webs 32 and curves 34 have been applied to the surface 38 of the carried plate 36 by the method illustrated in FIG. 3, the carrier plate 36 is burned. As a result, the ceramic webs 32 and/or curves 34 become connected to the carrier plate 36 which is formed from glass.

Different structural elements, inter alia also a plurality of letters, can be formed on the surface 38 of the carrier plate 36 by the method illustrated in FIG. 3. However, the structural elements on the touch pad 30 serve as sensing aids or orientation aids which can be sensed haptically. A user of the touch pad 30 can therefore feel different control areas 52, 56, 60 on the touch pad 30 without having to direct his gaze onto the surface 38. For example radio stations can be selected by the control areas 52 or control panels which are delimited from one another here by the straight webs 32 which are parallel to one another and arranged on an upper edge 54 of the touch pad 30. However, depending on the operating state of the touch pad 30 any further or different functions can be stored in these control areas 52 of the touch pad 30.

Further control areas 56 at lateral edges of the touch pad 30 are delimited here by the curves 34, and these control areas 56 can be assigned to different functions. A further control area 60 can be felt here by the user by another of the webs 32 at a lower edge 58 of the touch pad 30.

The structural elements which are shown here by way of example in the form of the webs 32 and the curves 34 can also be provided at other locations on the touch pad 30 and can have shapes which differ from the shapes shown by way of example in FIG. 5.

The carrier plate 36 is formed here from a glass, but the structural elements made of ceramic can also be applied by the method illustrated with reference to FIG. 3 to a carrier plate 36 which has merely a surface made of glass. The height of the structural elements which serve as sensing aids can also be set here by the consistency of the ceramic paste 48, which can be comparatively viscous, and the thickness of the piece of sheet metal of the stencil 42.

The ceramic paste 48 can also be embodied as a colored paste-like material in order to form correspondingly colored structural elements on the surface 38 of the carrier plate 36.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method for producing a control element for a motor vehicle, the control element having a touch-sensitive zone, the method comprising:
    arranging a stencil formed by a piece of sheet metal directly in contact with a carrier plate, the stencil having at least one cutout, the at least one cutout in the stencil being free of any threads, fibers or loops;
    applying a paste material to the at least one cutout in the stencil; and
    pressing the paste material through the at least one cutout to form at least one raised structural element on the carrier plate, the paste material being applied to the at least one cutout in such a way that the at least one raised structural element has a total height from the carrier plate corresponding to a thickness of the stencil, the at least one raised structural element forming a haptically perceptible sensing aid, wherein
    the carrier plate serves as a surface of a touchpad such that a user of the touchpad can feel control areas defined by the at least one raised structural element.

2. The method as claimed in claim 1, wherein the paste material is a ceramic material.

3. The method as claimed in claim 1, wherein the carrier plate is formed from a glass.

4. The method as claimed in claim 3, further comprising: heating the paste material to secure the paste material to the carrier plate.

5. The method as claimed in claim 1, wherein the at least one cutout in the stencil is produced by laser cutting.

6. The method as claimed in claim 1, wherein
    the stencil has first and second areas,
    the first and second areas of the stencil have different thicknesses,
    the first and second areas produce first and second raised structural elements, respectively, and
    the first and second raised structural elements have different thicknesses, corresponding respectively to the different thicknesses of the stencil.

7. The method as claimed in claim 1, wherein
    the carrier plate is formed of a glass of a touch screen,
    a plurality of raised structural elements are provided on the carrier plate to delimit different areas of the carrier plate, and
    the raised structural elements are selected from the group consisting of webs, letters and symbols.

8. The method as claimed in claim 1, wherein the paste material is pressed through the at least one cutout using a doctor blade.

9. The method as claimed in claim 1, wherein the paste material is colored so that the at least one raised structural element is also colored.

10. The method as claimed in claim 2, wherein the carrier plate is formed from a glass.

11. The method as claimed in claim 10, further comprising:
    heating the paste material to secure the paste material to the carrier plate.

12. The method as claimed in claim 11, wherein the at least one cutout in the stencil is produced by laser cutting.

* * * * *